US008043729B2

(12) United States Patent
Sundström et al.

(10) Patent No.: US 8,043,729 B2
(45) Date of Patent: Oct. 25, 2011

(54) COATED CUTTING TOOL INSERT

(75) Inventors: Rickard Sundström, Älta (SE); Susanne Norgren, Huddinge (SE); Marie Pettersson, Älvsjö (SE); Leif Åkesson, Älvsjö (SE); Björn Ljungberg, Enskede (SE)

(73) Assignee: Sandvik Intellectual Property AB, Sandviken (SE)

( * ) Notice: Subject to any disclaimer, the term of this patent is extended or adjusted under 35 U.S.C. 154(b) by 996 days.

(21) Appl. No.: 11/635,782

(22) Filed: Dec. 8, 2006

(65) Prior Publication Data

US 2007/0148497 A1     Jun. 28, 2007

(30) Foreign Application Priority Data

Dec. 16, 2005 (SE) .................................... 0502777

(51) Int. Cl.
*B32B 9/00* (2006.01)

(52) U.S. Cl. ............ 428/698; 51/307; 51/309; 407/119; 428/216; 428/325; 428/336; 428/472; 428/701; 428/702

(58) Field of Classification Search .................. 51/307, 51/309; 428/216, 325, 336, 472, 698, 701, 428/702; 407/119; 427/255.1, 255.2, 255.7
See application file for complete search history.

(56) References Cited

U.S. PATENT DOCUMENTS

| | | | | |
|---|---|---|---|---|
| 5,750,247 A * | 5/1998 | Bryant et al. | | 51/309 |
| 5,945,207 A * | 8/1999 | Kutscher et al. | | 428/216 |
| 6,027,808 A * | 2/2000 | Aoki et al. | | 428/698 |
| 6,062,776 A | 5/2000 | Sandman et al. | | |
| 6,200,671 B1 | 3/2001 | Lindskog et al. | | |
| 6,207,262 B1 * | 3/2001 | Ichikawa et al. | | 428/701 |
| 6,254,658 B1 * | 7/2001 | Taniuchi et al. | | 51/307 |
| 6,273,930 B1 * | 8/2001 | Waldenstrom | | 75/240 |
| 6,333,098 B1 * | 12/2001 | Olsson et al. | | 428/698 |
| 6,406,224 B1 | 6/2002 | Östlund et al. | | |
| 7,153,562 B2 * | 12/2006 | Rodmar et al. | | 428/336 |
| 7,431,977 B2 * | 10/2008 | Hessman | | 428/325 |
| 2004/0067115 A1 | 4/2004 | Yamamoto | | |
| 2006/0006576 A1 | 1/2006 | Karos | | |
| 2006/0204757 A1 | 9/2006 | Ljungberg | | |

FOREIGN PATENT DOCUMENTS

EP              0 736 615          8/1999

(Continued)

OTHER PUBLICATIONS

Fang, "Correlation of transverse rupture strength of WC-Co with hardness", International Journal of Refractory Metals and Hard Materials, 2005, 23, pp. 119-127.

(Continued)

*Primary Examiner* — Archene Turner
(74) *Attorney, Agent, or Firm* — Drinker Biddle & Reath LLP

(57) ABSTRACT

The present invention discloses a coated cutting tool insert particularly useful for dry and wet machining, preferably milling, in low and medium alloyed steels, stainless steels, with or without raw surface zones under severe conditions such as vibrations, long overhang and recutting of chips. The insert is characterized by WC—Co cemented carbide with a W and Cr alloyed Co-binder phase and a coating including at least three $TiC_xN_yO_z$ layers and a top layer at least on the rake face of a smooth $\alpha\text{-}Al_2O_3$.

20 Claims, 1 Drawing Sheet

FOREIGN PATENT DOCUMENTS

| | | |
|---|---|---|
| EP | 1 038 989 B1 | 9/2000 |
| EP | 1 209 255 A2 | 5/2002 |
| EP | 1 262 576 A1 | 12/2002 |
| EP | 1 222 316 B1 | 6/2004 |
| EP | 1 788 123 A1 | 5/2007 |
| WO | 97/20082 | 6/1997 |
| WO | WO 01/16389 A1 | 3/2001 |
| WO | 2004/056513 | 7/2004 |

OTHER PUBLICATIONS

Roebuck, "Terminology, Testing, Properties, Imaging and Models for Fine Grained Hardmetals", International Journal of Refractory Metals and Hard Materials, 1995, 13, pp. 265-279.

Partial Translation of Israeli Patent Office Action for Israeli patent application No. 180060.

* cited by examiner

COATED CUTTING TOOL INSERT

BACKGROUND OF THE INVENTION

The present invention relates to a coated cemented carbide cutting tool insert particularly useful for toughness demanding wet and dry machining, preferably milling, of low and medium alloyed steels and stainless steels, with raw surfaces such as cast skin, forged skin, hot or cold rolled skin or pre-machined surfaces under unstable conditions.

When machining low and medium alloyed steels and stainless steels with cemented carbide tools, the cutting edge is subjected to wear according to different mechanisms, such as chemical wear, abrasive wear, adhesive wear and to edge chipping caused by cracks formed along the cutting edge, the so called comb cracks. Under severe cutting conditions, bulk and edge line breakages commonly occur.

Different work piece materials and cutting conditions require different properties of the cutting insert. For example, when cutting steel components with raw surface zones or cutting under other difficult conditions, a coated cemented carbide insert must be based on a tough carbide substrate and have a coating with excellent adhesion. When machining low alloyed steels and stainless steels, the adhesive wear is generally the dominating wear type. Here, generally thin (1-3 μm) CVD- or PVD-coatings have to be used.

Measures can be taken to improve or optimize cutting performance with respect to a specific wear type. However, very often such measures will have a negative effect on other wear properties.

The influence of some possible measures is given below:

1.) Comb crack formation can be reduced by lowering the binder phase content. However, low binder content will lower the toughness properties of the cutting inserts which is far from desirable.

2.) Improved abrasive wear can be obtained by increasing the coating thickness. However, thick coatings increase the risk for flaking and will also lower the resistance to adhesive wear.

3.) Machining at high cutting speeds and at other conditions leading to high cutting edge temperatures require a cemented carbide with higher amounts of cubic carbides (solid solution of WC—TiC—TaC—NbC), but such carbides will promote comb crack formation.

4.) Improved toughness can be obtained by increasing the cobalt binder content. However, high cobalt content decreases the resistance to plastic deformation.

So far it has been very difficult to improve all tool properties simultaneously. Commercial cemented carbide grades have therefore been optimized with respect to one or a few of the mentioned wear types and hence to specific cutting application area.

U.S. Pat. No. 6,062,776 discloses a coated cutting tool insert particularly useful for milling in low and medium alloyed steel with or without raw surface zones during wet or dry conditions. The insert is characterized by WC—Co cemented carbide with a low content of cubic carbides and a highly W-alloyed binder phase, a coating including an innermost layer of $TiC_xN_yO_z$ with columnar grains and a layer of $\kappa$-$Al_2O_3$ with a top layer of TiN.

U.S. Pat. No. 6,406,224 discloses a coated cutting tool insert also particularly useful for milling of alloyed steel with or without abrasive surface zones at high cutting speeds. The coated cutting tool insert consists of a cemented carbide body with a composition of 7.1-7.9 wt % Co, 0.2-1.8 wt % cubic carbides of the metals Ta, Nb and Ti and balance WC. The insert is coated with an innermost layer of $TiC_xN_yO_z$ with columnar grains and a layer of $\kappa$-$Al_2O_3$ with a top layer of TiN.

EP-A-736615 discloses a coated cutting insert particularly useful for dry milling of grey cast iron. The insert is characterized by having a straight WC—Co cemented carbide substrate and a coating consisting of a layer of $TiC_xN_yO_z$ with columnar grains and a top layer of fine grained textured $\alpha$-$Al_2O_3$.

US 2006/0204757 A discloses a coated cutting tool insert suitable for machining of metals by turning, milling, drilling or by similar chip forming machining methods. The tool insert is particularly useful for interrupted toughness demanding cutting operations.

U.S. Pat. No. 6,200,671 discloses a coated turning insert particularly useful for turning in stainless steel. The insert is characterised by a WC—Co-based cemented carbide substrate having a highly W-alloyed Co-binder phase and a coating including an innermost layer of $TiC_xN_yO_z$ with columnar grains and a top layer of TiN and an inner layer of fine grained $\kappa$-$Al_2O_3$.

OBJECTS AND SUMMARY OF THE INVENTION

It is an object of the invention to avoid or alleviate the problems of the prior art.

In one aspect of the invention, there is provided a cutting insert comprising a cemented carbide body and a coating wherein said cemented carbide body has a composition of from about 12.0 to about 15.0 wt % Co, from about 0.52 to about 0.64 wt % Cr, balance WC, with a CW-ratio in the range of from about 0.76 to about 0.84 and a HcJ value in the range of from about 12.5 to about 14.5 kA/m; said insert being at least partly coated with an from about 4.1 to about 6.9 μm thick coating including at least three layers of $TiC_xN_yO_z$ of which one is adjacent to the cemented carbide and a blasted $\alpha$-$Al_2O_3$-layer being the outer layer at least on the rake face, the $TiC_xN_yO_z$ layers having a total thickness of from about 1.9 to about 3.6 μm comprising a first $TiC_xN_yO_z$ layer adjacent to the cemented carbide having a composition of x+y=1, x equal to or greater than about 0, a second $TiC_xN_yO_z$ layer having a composition of x more than about 0.4, y more than about 0.4 and z is equal to or greater than 0 but less than about 0.1, a third $TiC_xN_yO_z$ layer adjacent to the $\alpha$-$Al_2O_3$-layer having a composition of x+y+z equal to or more than about 1 and z more than about 0, and the $\alpha$-$Al_2O_3$-layer having a thickness of from about 1.8 to about 3.6 μm with flattened grains on the surfaces that have been subjected to the blasting treatment.

In another aspect of the invention, there is provided a method of making a cutting insert comprising a cemented carbide body and a coating by powder metallurgical technique, wet milling of powders forming hard constituents and binder phase, compacting the milled mixture to bodies of desired shape and size and sintering wherein said cemented carbide body has a composition of from about 12.0 to about 15.0 wt % Co, from about 0.52 to about 0.64 wt % Cr, balance WC with a polarization coercivity, HcJ, of from about 12.5 to about 14.5 kA/m, and a CW-ratio of from about 0.76 to about 0.84, and said body is at least partly coated with a from about 4.1 to about 6.9 μm thick coating including at least three layers of $TiC_xN_yO_z$ forming an inner coating with an $\alpha$-$Al_2O_3$-layer as the outer layer at least on the rake face whereby the $TiC_xN_yO_z$-layers having a total thickness of from about 1.9 to about 3.6 μm comprising a first $TiC_xN_yO_z$ layer adjacent to the cemented carbide having a composition of x+y=1 with x being equal to or greater than 0 using known CVD method using a reaction mixture consisting of $TiCl_4$, $H_2$ and $N_2$, a second $TiC_xN_yO_z$ layer having a composition of x more than about 0.4, y more than about 0.4 and z being equal to or greater than 0 but less than about 0.1, by a MTCVD-technique at a temperature of from about 885 to about 850° C. and with $CH_3CN$ as the carbon/nitrogen source, a third $TiC_xN_yO_z$ layer adjacent to the $\alpha$-$Al_2O_3$-layer having a composition of x+y+z equal to or more than about 1 and z greater than about 0 using known CVD method using a reaction mixture consisting of $TiCl_4$, $H_2$ and $N_2$, the $\alpha$-$Al_2O_3$-layer having a thickness of from about 1.8 to about 3.6 μm deposited by using known CVD-technique and subjecting the insert to a blasting treatment at least on the rake face.

In still another aspect of the invention, there is provided the use of an insert as described above for toughness demanding wet and dry milling of low and medium alloyed steels and stainless steels, with raw surfaces such as cast skin, forged skin, hot or cold rolled skin or pre-machined surfaces under unstable conditions at and cutting speeds and feedrates according to the following: milling with about 90° entering angle at cutting speed of from about 25 to about 350 m/min and feed rate: from about 0.04 to about 0.4 mm/tooth or facemilling at from about 45 to about 75° entering angle at cutting speed of from about 25 to about 350 m/min and feed rate: of about 0.05 to about 0.7 mm/tooth or high feed milling applications at cutting speed of from about 25 to about 350 m/min and feed rate: from about 0.30 to about 3.0 mm/tooth.

DETAILED DESCRIPTION OF THE PREFERRED EMBODIMENTS

Figure 1:
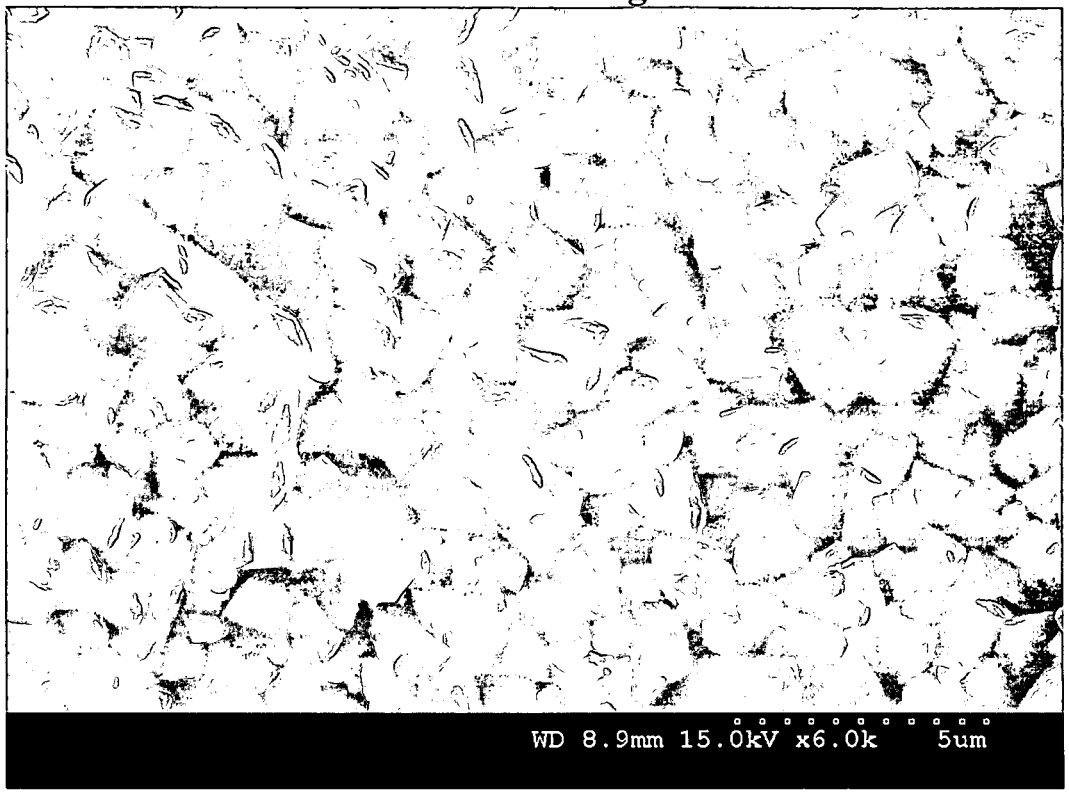
FIGS. 1 and 2 show in 6000× a SEM image of an alumina layer in top view before blasting, FIG. 1, and after blasting, FIG. 2.

The inventors have surprisingly found that by combining a number of specific features, an improved cutting tool insert, preferably for milling, can be obtained. The combined features are: a specific cemented carbide composition, a certain WC grain size, alloyed binder phase, an inner coating consisting of a number of defined layers and a smooth top rake face layer of $\alpha$-$Al_2O_3$.

The insert has an improved cutting performance in low and medium alloyed steel, with or without raw surface zones preferably under unstable conditions such as vibrations, long overhang, chip-hammering or recutting of chips or in generally toughness demanding operations both in wet and dry conditions. It is also surprising that the invented cutting tool insert also works well in stainless steel. The cutting tool according to the invention shows improved cutting properties compared to prior art inserts with respect to many of the wear types earlier mentioned. In particular comb crack toughness behaviour has been improved.

The cutting tool insert according to the invention comprises a cemented carbide body with a W and Cr alloyed Co-binder phase, a well balanced chemical composition and a well selected grain size of the WC, a coating comprising a columnar $TiC_xN_yO_z$-inner layer followed by a smooth $\alpha$-$Al_2O_3$-top layer. A TiN-layer is preferably the top layer at the clearance faces of the insert.

According to the present invention, a coated cutting tool insert is provided of a cemented carbide body with a composition of from about 12.0 to about 15.0 wt % Co, preferably from about 12.5 to about 14.5 wt % Co, most preferably from about 13 to about 14 wt % Co, from about 0.52 to about 0.64 wt % Cr, preferably from about 0.54 to about 0.62 wt % Cr, most preferably from about 0.55 to about 0.61 wt % Cr and balance WC. The cemented carbide body may also contain smaller amounts of other elements but on a level corresponding to a technical impurity. The polarization coercivity, HcJ, measured according to IEC standard 60404-7, is indirectly a measure of the WC grain size and should have a value in the range from about 12.5 to about 14.5 kA/m, preferably within from about 12.7 to about 14.0 kA/m. The cobalt binder phase is alloyed with a certain amount of W and Cr giving the present cemented carbide cutting insert its desired properties. W and Cr in the binder phase influence the magnetic properties of cobalt and can hence be related to a value CW, defined as CW=magnetic-% Co/wt-% Co where magnetic-% Co is the weight percentage of magnetic material and wt % Co is the weight percentage of Co in the cemented carbide.

The CW-value can vary between 1 and about 0.6 depending on the degree of alloying. Lower CW-values correspond to higher W and Cr contents in the binder phase and CW=1 corresponds practically to an absence of W and Cr in the binder phase.

It has now been found according to the present invention that improved cutting performance is achieved if the cemented carbide body has a CW-ratio in the range from about 0.76 to about 0.84, preferably within from about 0.78 to about 0.82, and most preferably within from about 0.79 to about 0.81. The cemented carbide may also contain small amounts, less than about 1 volume %, of η-phase ($M_6C$), without any detrimental effects. From the specified CW-values (less than about 1) it also follows that no free graphite is allowed in the cemented carbide body according to the present invention.

The cemented carbide insert is at least partly coated with a from about 4.1 to about 6.9 μm thick coating including at least three layers of $TiC_xN_yO_z$. The three layers form an inner coating with an $\alpha$-$Al_2O_3$-layer as the outer layer at least on the rake face. The $TiC_xN_yO_z$-layers has a total thickness of from about 1.9 to about 3.6 μm and comprises:

A first $TiC_xN_yO_z$ layer, from about 0.1 to about 1 μm, adjacent to the cemented carbide having a composition of x+y=1, x equal to or greater than about 0, preferably x is less than about 0.2 and z is equal to about 0.

A second $TiC_xN_yO_z$ layer, from about 1 to about 3.4 μm, having a composition of x more than about 0.4, y more than about 0.4 and z equal to or greater than about zero but less than about 0.1, preferably z is about 0.

A third $TiC_xN_yO_z$ layer, from about 0.1 to about 1 μm, adjacent to the $\alpha$-$Al_2O_3$-layer having a composition of x+y+z greater than or equal to about 1 and z more than about 0, preferably z is more than about 0.2, x+y+z=1 and y is less than about 0.2.

The outer $\alpha$-$Al_2O_3$-layer has a thickness of from about 1.8 to about 3.6 μm with flattened grains on the surfaces that have been subjected to the blasting treatment.

In a preferred embodiment, the insert has a thin, from about 0.1 to about 1 μm, colored top layer at the flank faces preferably of TiN, TiCN, TiC, ZrN or HfN, most preferably deposited by CVD technique.

The present invention also relates to a method of making a coated cutting tool insert by powder metallurgical technique, wet milling of powders forming hard constituents and binder phase, compacting the milled mixture to bodies of desired shape and size and sintering, of a cemented carbide body with a composition of from about 12.0 to about 15.0 wt % Co, preferably from about 12.5 to about 14.5 wt % Co, most preferably from about 13 to about 14 wt % Co, from about 0.52 to about 0.64 wt % Cr, preferably from about 0.54 to about 0.62 wt % Cr, most preferably from about 0.55 to about 0.61 wt % Cr and balance WC. The cemented carbide body may also contain smaller amounts of other elements but on a level corresponding to a technical impurity. The milling and sintering conditions are chosen to obtain an as sintered structure with polarization coercivity, HcJ, of from about 12.5 to about 14.5 kA/m, preferably from about 12.7 to about 14.0 kA/m and an CW-ratio of from about 0.76 to about 0.84, preferably from about 0.78 to about 0.82, and most preferably from about 0.79 to about 0.81.

The cemented carbide insert body is at least partly coated with a from about 4.1 to about 6.9 μm thick coating including at least three layers of $TiC_xN_yO_z$ forming an inner coating with a blasted $\alpha$-$Al_2O_3$-layer as the outer layer at least on the rake face. The $TiC_xN_yO_z$-layers having a total thickness of from about 1.9 to about 3.6 μm and comprise:

A first $TiC_xN_yO_z$ layer, from about 0.1 to about 1 μm, adjacent to the cemented carbide having a composition of x+y=1, x equal to or greater than about 0, preferably x less than about 0.2 and z=about 0, using known CVD methods using a reaction mixture of $TiCl_4$, $H_2$ and $N_2$.

A second $TiC_xN_yO_z$ layer, from about 1 to about 3.4 μm, having a composition of x more than about 0.4, y more than about 0.4 and z equal to or greater than about 0 but less than about 0.1, preferably z=about 0 by using the well-known MTCVD-technique, at a temperature of from about 885 to about 850° C. and $CH_3CN$ as the carbon/nitrogen source.

A third $TiC_xN_yO_z$ layer, from about 0.1 to about 1 μm, adjacent to the $\alpha$-$Al_2O_3$-layer having a composition of x+y+z equal to or greater than about 1 and z more than about 0, preferably z more than about 0.2, x+y+z=1 and y less than about 0.2 using known CVD methods using a reaction mixture of $TiCl_4$, $H_2$ and $N_2$, An $\alpha$-$Al_2O_3$-layer with a thickness of from about 1.8 to about 3.6 μm with flattened grains on the surfaces that have been subjected to the blasting treatment deposited by using known CVD-techniques, and subjecting the insert to a blasting treatment at least on the rake face.

In one embodiment, an additional from about 0.1 to about 1 μm, colored, layer is deposited on top of the $\alpha$-$Al_2O_3$-layer, preferably of TiN, TiCN, TiC, ZrN or HfN preferably using CVD technique prior to the blasting treatment.

In another embodiment after the blasting treatment, an additional 0.1-1 μm, colored, top layer is deposited at least at the flank faces preferably of TiN, TiCN, TiC, ZrN or HfN using CVD- or PVD-technique, preferably using CVD technique.

The present invention also relates to the use of an insert according to above for toughness demanding wet and dry machining, preferably milling, of low and medium alloyed steels and stainless steels, with raw surfaces such as cast skin, forged skin, hot or cold rolled skin or pre-machined surfaces at cutting speeds and feed rates according to following table:

Milling about with 90° entering angle:
  Cutting speed: from about 25 to about 350 m/min, preferably from about 100 to about 250 m/min and feed rate: 0.04-0.4 mm/tooth
Facemilling (from about 45 to about 75° entering angle):
  Cutting speed: from about 25 to about 350 m/min, preferably from about 100 to about 250 m/min and feed rate: from about 0.05 to about 0.7 mm/tooth High feed milling concepts:
  Cutting speed: from about 25 to about 350 m/min and feed rate: from about 0.30 to about 3.0 mm/tooth, preferably from about 0.3 to about 1.8 mm/tooth.

The invention is additionally illustrated in connection with the following examples, which are to be considered as illustrative of the present invention. It should be understood, however, that the invention is not limited to the specific details of the examples.

EXAMPLE 1

Invention

Cemented carbide milling inserts in the following styles R390-11T308M-PM, R390-170408M-PM, R245-12T3M-PM, R300-1648M-PH and R300-1240M-PH having a composition of 13.5 wt-% Co, 0.58 wt-% Cr, balance WC and with a HcJ value of 13 kA/m and a CW-value of 0.80 as measured in the FÖRSTER KOERZIMAT CS 1.096 from Foerster Instruments Inc. were made. The inserts were then coated as follows:

a first layer of 0.5 μm $TiC_xN_yO_z$ with a composition of about x=0.05, y=0.95 and z=0 using known CVD method using a reaction mixture consisting of $TiCl_4$, $H_2$ and $N_2$, a second layer of 1.7 μm columnar $TiC_xN_yO_z$ with a composition of about x=0.55, y=0.45 and z=0 by using the well-known MTCVD-technique, temperature 885-850° C. and $CH_3CN$ as the carbon/nitrogen source and a third, bonding layer of 0.5 μm $TiC_xN_yO_z$. The grains of this third layer were needle shaped and the composition was about x=0.5, y=0 and z=0.5 a fourth layer consisting of 2.5 μm $\alpha$-$Al_2O_3$ and finally a top layer of about 0.3 μm TiN was deposited by using known CVD-technique. XRD-measurements confirmed that the $Al_2O_3$-layer consisted to 100% of the $\alpha$-phase.

Figure 2:
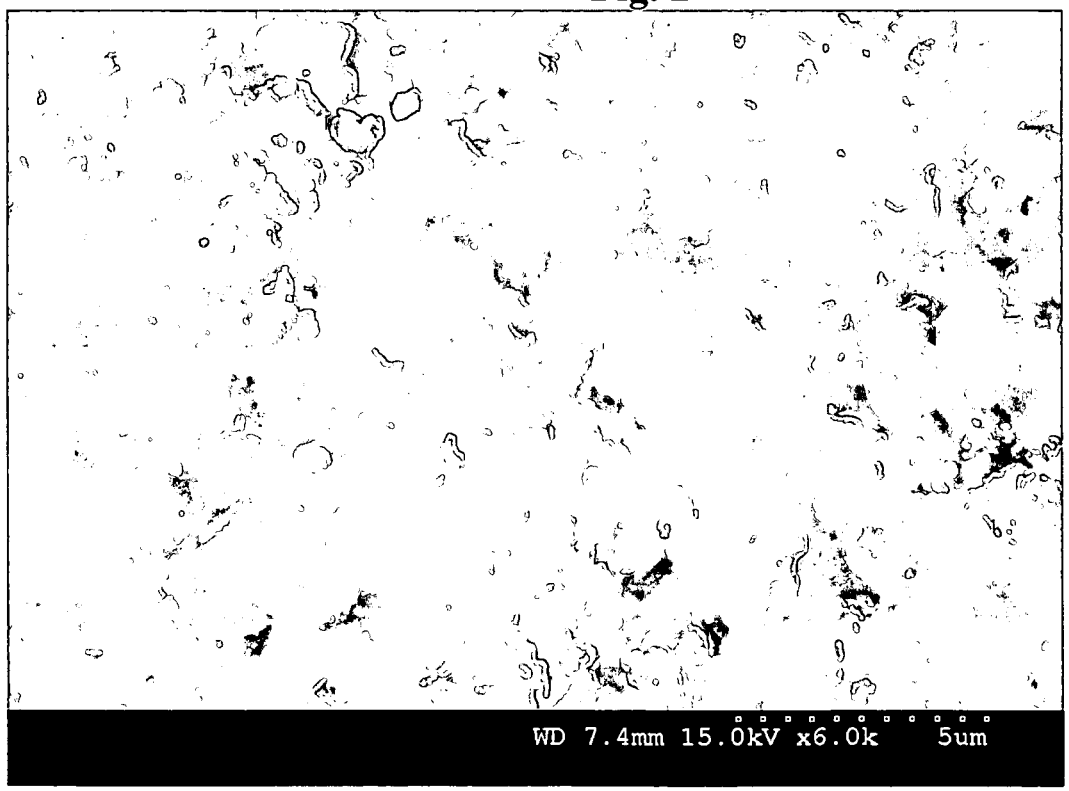

After the coating cycle, the top side (rake face) of the inserts was subjected to intense wet blasting with a slurry of $Al_2O_3$ grits and water. The blasting treatment removed the top TiN-layer on the rake face exposing a smooth $\alpha$-$Al_2O_3$ with most grains flattened as illustrated in FIGS. 1 and 2 which show in 6000× an SEM image in top view of the alumina layer before blasting, FIG. 1, and after blasting, FIG. 2.

EXAMPLE 2

Prior Art

Cemented carbide milling inserts in the following styles R390-11T308M-PM, R390-170408M-PM, R245-12T3M-PM, R300-1648M-PH and R300-1240M-PH with a composition of 11.5 wt-% Co, 1.25 wt-% TaC, 0.30 wt-% NbC and balance WC and with a HcJ value of 10.4 kA/m and a CW-value of 0.94 as measured in a KOERZIMAT CS 1.096 from Foerster Instruments Inc. were coated as follows:

a first layer of 0.5 μm equiaxed $TiC_xN_y$-layer (with a high nitrogen content corresponding to an estimated x=0.95 and y=0.05) followed by a 4 μm thick TiCN-layer, with columnar grains by using MTCVD-technique at a temperature 885-850° C. and with $CH_3CN$ as the carbon/nitrogen source. In subsequent steps during the same coating cycle, a 1.0 μm thick layer of $Al_2O_3$ was deposited using a temperature 970° C. and a concentration of $H_2S$ dopant of 0.4% as disclosed in EP-A-523 021. A thin, 0.3 μm, layer of TiN was deposited on top according to known CVD-technique. XRD-measurement showed that the $Al_2O_3$-layer consisted of 100% κ-phase. The cemented carbide body had a WC grain size in average of 1.7 μm. The coated inserts were brushed with a nylon brush with straws containing hard SiC grains. Examination of the brushed inserts in a light microscope showed that the top TiN-layer had been brushed away along the cutting edge leaving there a smooth $Al_2O_3$-surface. Coating thickness measurements on cross sectioned brushed samples showed that the layer thickness of the $Al_2O_3$-layer along the edge line had been reduced by about 50%.

EXAMPLE 3

Inserts of the different styles from examples 1 and 2 were compared in cutting tests.
  Operation 1: Shoulder milling-roughing, R390-32 mm
  Work-piece: Test piece
  Material: 42CrMo4, 300HB, medium alloyed steel
  Cutting speed: 150 m/min
  Feed rate/tooth: 0.17 mm/tooth.
  Depth of cut: 3 mm
  Insert-style: R390-11T308M-PM
  Note: 1 insert, dry, very toughness demanding due to heavy chipload at exit of the milling cutter.
  Tool-life criterion was chipping of the edge line and breakages.
  Results: Tool-life, passes:
  Invention A: 47
  Prior art B: 20
  Operation 2: Shoulder milling, R390-32 mm
  Work-piece: Plate steel
  Material: SS2134, low alloyed steel
  Cutting speed: 181 m/min
  Feed rate/tooth: 0.17 mm/tooth
  Depth of cut: 10 mm
  Insert-style: R390-170408M-PM
  Note: Three inserts in the cutter, dry, upmilling due to component and program
  Tool-life criterion was flank wear and edge-line chipping
  Results: Tool-life, parts made
  Invention A: 15
  Prior art B: 5
  Operation 3: Face milling-roughing, R245-63 mm
  Work-piece: Connecting rod
  Material: 49MnVS3
  Cutting speed: 198 m/min
  Feed rate/tooth: 0.20 mm/tooth
  Depth of cut: 4 mm
  Insert-style: R245-12T3M-PM
  Note: Dry, six inserts, forging skin, bad exit angles due to component complexity
  Tool-life criterion was chipping of the edge leading to burr on workpiece.
  Results: Tool-life, min:
  Invention A: 404
  Prior art B: 110
  Operation 4: Face milling-roughing, R300-100 mm
  Work-piece: Link mechanism
  Material: cast SS2225-23
  Cutting speed: 157 m/min
  Feed rate/tooth: 0.24 mm/tooth
  Depth of cut: 3-5 mm
  Insert-style: R300-1648M-PH
  Note: dry, eight teeth, difficult to machine due to cast skin.
  Tool-life criterion was chipping in the edge line due to comb cracks. The good result leads to better reliability during unmanned machining.
  Results: Tool-life, min:
  Invention A: 76
  Prior art B: 47
  Operation 5: Face and profile milling, R300-80 mm
  Work-piece: Injection mould
  Material: Impax Supreme 30HRc, tool steel
  Cutting speed: 150 m/min
  Feed rate/tooth: 0.6 mm/tooth
  Depth of cut: 1 mm
  Insert-style: R300-1240M-PH
  Note: Dry, six inserts, contour profile milling, high table feed
  Tool-life criterion was chipping due to comb crack formation.
  Results: Tool-life, min:
  Invention A: 93
  Prior art B: 47
  From the result from the cutting tests it is clear that the inserts from example 1 outperform the prior art inserts according to example 2.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A cutting insert comprising a cemented carbide body and a coating wherein said cemented carbide body has a composition of from about 12.5 to about 14.5 wt % Co, from about 0.52 to about 0.64 wt % Cr, balance WC, with a CW-ratio in the range of from about 0.76 to about 0.84 and a polarization coercivity, HcJ, value in the range of from about 12.5 to about 14.5 kA/m;
  said insert being at least partly coated with an from about 4.1 to about 6.9 μm thick coating including at least three layers of $TiC_xN_yO_z$ of which one is adjacent to the cemented carbide and a blasted $\alpha$-$Al_2O_3$-layer being the outer layer at least on the rake face, the $TiC_xN_yO_z$ layers having a total thickness of from about 1.9 to about 3.6 μm comprising:
  a first $TiC_xN_yO_z$ layer adjacent to the cemented carbide having a composition of x+y=1, x equal to or greater than about 0,
  a second $TiC_xN_yO_z$ layer having a composition of x more than about 0.4, y more than about 0.4 and z is equal to or greater than about zero but less than about 0.1,
  a third $TiC_xN_yO_z$ layer adjacent to the $\alpha$-$Al_2O_3$-layer having a composition of x+y+z equal to or more than about 1 and z more than about 0, and
  the $\alpha$-$Al_2O_3$-layer having a thickness of from about 1.8 to about 3.6 μm with flattened grains on the surfaces that have been subjected to the blasting treatment.

2. The cutting insert of claim 1 wherein said cemented carbide body comprises from about 12.5 to about 14.5 wt-% Co, from about 0.54 to about 0.62 wt-% Cr with a CW-ratio of from about 0.78 to about 0.82 and a HcJ value of from about 12.7 to about 14.0 kA/m.

3. The cutting insert of claim 2 wherein said cemented carbide body comprises from about 13 to about 14 wt-% Co and 0.55 to about 0.61 wt-% Cr.

4. The cutting insert of claim 2 wherein in said first $TiC_xN_yO_z$ layer, x is less than about 0.2 and z is about 0.

5. The cutting insert of claim 1 wherein in said second $TiC_xN_yO_z$ layer, z is about 0.

6. The cutting insert of claim 1 wherein said third $TiC_xN_yO_z$ layer, z is less than about 0.2.

7. The cutting insert of claim 1 wherein in said third $TiC_xN_yO_z$ layer, z is less than about 0.2, x+y+z=1 and y is less than about 0.2.

8. The cutting insert of claim 1 wherein the cemented carbide contains from about 13.3 to about 13.7 wt-% Co and from about 0.56 to about 0.60 wt-% Cr.

9. The cutting tool insert of claim 1 wherein there is a from about 0.1 to about 1 μm colored top layer at the flank faces.

10. The cutting tool insert of claim 9 wherein the colored layer is TiN, TiCN, TiC, ZrN and/or HfN deposited by CVD- or PVD-technique.

11. Method of making a cutting insert comprising a cemented carbide body and a coating by powder metallurgical technique, wet milling of powders forming hard constituents and binder phase, compacting the milled mixture to bodies of desired shape and size and sintering wherein said cemented carbide body has a composition of from about 12.5 to about 14.5 wt % Co, from about 0.52 to about 0.64 wt % Cr, balance WC with a polarization coercivity, HcJ, of from about 12.5 to about 14.5 kA/m, and a CW-ratio of from about 0.76 to about 0.84, and said body is at least partly coated with a from about 4.1 to about 6.9 μm thick coating including at least three layers of $TiC_xN_yO_z$ forming an inner coating with an $\alpha$-$Al_2O_3$-layer as the outer layer at least on the rake face whereby the $TiC_xN_yO_z$-layers having a total thickness of from about 1.9 to about 3.6 μm comprising:
- a first $TiC_xN_yO_z$ layer adjacent to the cemented carbide having a composition of x+y=1, with x being equal to or greater than zero using known CVD method using a reaction mixture of $TiCl_4$, $H_2$ and $N_2$,
- a second $TiC_xN_yO_z$ layer having a composition of x more than about 0.4, y more than about 0.4 and z being equal to or greater than zero but less than about 0.1 by a MTCVD-technique at a temperature of from about 885 to about 850° C. and with $CH_3CN$ as the carbon/nitrogen source,
- a third $TiC_xN_yO_z$ layer adjacent to the $\alpha$-$Al_2O_3$-layer having a composition of x+y+z being equal to or greater than about 1 and z greater than about 0 using known CVD method using a reaction mixture of $TiCl_4$, $H_2$ and $N_2$,
- the $\alpha$-$Al_2O_3$-layer having a thickness of from about 1.8 to about 3.6 μm deposited by using known CVD-technique and subjecting the insert to a blasting treatment at least on the rake face.

12. The method of claim 11 wherein said cemented carbide body comprises from about 12.5 to about 14.5 wt-% Co, from about 0.54 to about 0.62 wt-% Cr with a CW-ratio of from about 0.78 to about 0.82 and a HcJ value of from about 12.7 to about 14.0 kA/m.

13. The method of claim 12 wherein said cemented carbide body comprises from about 13 to about 14 wt-% Co and from about 0.55 to about 0.61 wt-% Cr.

14. The method of claim 13 wherein in said first $TiC_xN_yO_z$ layer, x is less than about 0.2 and Z is about 0.

15. The method of claim 11 wherein in said second $TiC_xN_yO_z$ layer, z is about 0.

16. The method of claim 11 wherein in said third $TiC_xN_yO_z$ layer, z is less than about 0.2.

17. The method of claim 11 wherein in said third $TiC_xN_yO_z$ layer, z is less than about 0.2, x+y+z=1 and y is less than about 0.2.

18. The method according to claim 11 further comprising depositing an additional from about 0.1 to about 1 μm colored layer on top of the $\alpha$-$Al_2O_3$-layer prior to the blasting treatment.

19. The method according to claim 18 further comprising depositing after the blasting treatment an additional from about 0.1 to about 1 μm colored top layer at the flank faces.

20. Use of an insert of claim 1 for toughness demanding wet and dry milling of low and medium alloyed steels and stainless steels, with raw surfaces such as cast skin, forged skin, hot or cold rolled skin or pre-machined surfaces under unstable conditions at and cutting speeds and feedrates according to the following:
- milling with about 90° entering angle at cutting speed of from about 25 to about 350 m/min and feed rate: from about 0.04 to about 0.4 mm/tooth or
- facemilling at from about 45 to about 75° entering angle at cutting speed of from about 25 to about 350 m/min and feed rate: of about 0.05 to about 0.7 mm/tooth or
- high feed milling applications at cutting speed of from about 25 to about 350 m/min and feed rate: from about 0.30 to about 3.0 mm/tooth.

* * * * *